United States Patent
Nord et al.

(10) Patent No.: US 7,023,285 B2
(45) Date of Patent: Apr. 4, 2006

(54) SELF-CALIBRATING CONTROLLABLE OSCILLATOR

(75) Inventors: Lars B. Nord, Lund (SE); Erik Bengtsson, Eslöv (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/887,938

(22) Filed: Jul. 9, 2004

(65) Prior Publication Data

US 2005/0012555 A1 Jan. 20, 2005

Related U.S. Application Data

(60) Provisional application No. 60/486,917, filed on Jul. 15, 2003.

(51) Int. Cl.
*H03L 7/00* (2006.01)

(52) U.S. Cl. .......................... 331/16; 331/17
(58) Field of Classification Search ........ 327/156–158; 331/10, 11, 16–17, 14
See application file for complete search history.

(56) References Cited

U.S. PATENT DOCUMENTS

| | | | |
|---|---|---|---|
| 5,160,900 A | 11/1992 | Visuri | |
| 5,220,295 A | 6/1993 | Glover et al. | |
| 5,394,444 A | 2/1995 | Silvey et al. | |
| 5,406,228 A | 4/1995 | Hoang | |
| 5,646,968 A * | 7/1997 | Kovacs et al. | 375/375 |
| 5,694,087 A | 12/1997 | Ferraiolo et al. | |
| 5,764,712 A | 6/1998 | Branstad et al. | |
| 5,933,058 A * | 8/1999 | Pinto et al. | 331/17 |
| 6,049,255 A | 4/2000 | Hagberg et al. | |
| 6,111,471 A | 8/2000 | Bonneau et al. | |
| 6,496,556 B1 * | 12/2002 | Huehne et al. | 377/2 |
| 6,545,547 B1 * | 4/2003 | Fridi et al. | 331/16 |
| 6,605,935 B1 | 8/2003 | Nilsson | |
| 6,747,519 B1 * | 6/2004 | Jaehne et al. | 331/16 |
| 6,859,073 B1 * | 2/2005 | Dai et al. | 327/105 |
| 6,870,411 B1 * | 3/2005 | Shibahara et al. | 327/156 |
| 6,903,613 B1 * | 6/2005 | Mitchell et al. | 331/11 |
| 2002/0043992 A1 | 4/2002 | McCune et al. | |
| 2003/0050029 A1 | 3/2003 | Kaufmann et al. | |

FOREIGN PATENT DOCUMENTS

| | | |
|---|---|---|
| EP | 1 168 627 A2 | 1/2002 |
| EP | 1 170 869 A2 | 1/2002 |
| EP | 1 189 347 A1 | 3/2002 |
| JP | 58-107729 | 6/1983 |
| WO | WO 03/044961 A2 | 5/2003 |

OTHER PUBLICATIONS

International Search Report, Aug. 11, 2004, European Patent Office.
Written Opinion of the International Searching Authority, Aug. 11, 2004, European Patent Office.

* cited by examiner

*Primary Examiner*—Dinh T. Le
(74) *Attorney, Agent, or Firm*—Potomac Patent Group PLLC

(57) ABSTRACT

The controllable oscillator in a phase-locked loop (PLL) can self-calibrate by tapping the PLL's feedback path with a suitable circuit or logic block. The logic block may include a counter. This enables the self-calibration/trimming to be handled completely within a product, such as a radio telephone, and no external instruments or software are needed for trimming.

18 Claims, 2 Drawing Sheets

SELF-CALIBRATING CONTROLLABLE OSCILLATOR

This application claims the benefit of the filing date of Provisional Patent Application No. 60/486,917 filed on Jul. 15, 2003, the entire content of which is incorporated here by reference.

BACKGROUND

This invention relates to controllable electronic-circuit oscillators and more particularly to calibration of controllable oscillators in phase-locked loops.

Phase locked loops (PLLs) are well known, and are useful in many types of circuits, including but not limited to radio circuitry. In digital communication systems, for example in mobile telephone communications operating under the GSM or DCS systems, PLLs may be employed to effect continuous phase modulation (CPM) of a carrier signal.

PLLs are often used to generate signals having frequencies that are integer divisions of reference frequencies, and fractional-N PLLs have been devised to achieve more flexible division factors. A fractional-N PLL includes a variable-modulus divider, rather than an integer divider. For example, performing three successive divisions by 20 followed by one division by 21 results in an average division factor of (3·20+21)/4=20.25.

Sigma-delta-controlled fractional-N PLLs are often used in radio systems to generate spurious-free local oscillator frequencies and to allow faster frequency jumps. By controlling the divider ratio with a sigma-delta modulator, modulation with a constant envelope can be generated. By using these properties of the fractional-N PLL, compact radio architectures for constant-envelope systems (e.g., GSM, DCS) can be developed. This also means that the complete radio can be integrated in the same application-specific integrated circuit (ASIC).

Sigma-delta-controlled fractional-N PLL modulators are described in, for example, U.S. Pat. No. 6,049,255 to H. Hagberg et al. Other uses of PLLs include phase detectors, such as those described in, for example, U.S. Pat. No. 6,605,935 to M. Nilsson et al.

U.S. Pat. No. 6,111,471 to Bonneau et al. describes an apparatus for setting the free-running frequency of a voltage-controlled oscillator (VCO) to a reference frequency. The apparatus includes a means for setting the frequency range of the VCO, a first counting means for counting to a first value at the VCO rate, a second counting means for counting to a second value at the reference frequency rate. The second counting means produces a reference count value when the first counting means reaches the first value. A state machine is responsive to the two counting means and selects a VCO frequency range such that the VCO-free running frequency is closest to the reference frequency based on a comparison of the duration of a decrementing reference count from the second counting means with the counting duration of the second counting means.

Other devices for setting the free-running frequency of a VCO are described in U.S. Pat. No. 5,746,712 to Branstad et al.; U.S. Pat. No. 5,694,087 to Ferraiolo et al.; U.S. Pat. No. 5,406,228 to Hoang; U.S. Pat. No. 5,394,444 to Silvey et al.; U.S. Pat. No. 5,220,295 to Glover et al.; and U.S. Pat. No. 5,160,900 to Visuri; European Patent Publications EP 1170869 by Paananen; and EP 1168627 by Hirano et al.; and Japanese Patent Abstract JP 58/107729 by Ogino.

In some radio designs, only one mandatory trimming, or adjustment, is required, and that is trimming of the frequency of a VCO in the PLL. In general, the trimming process proceeds as follows: set a start value of the control voltage; measure the oscillator's output frequency; check whether the measured frequency is within the target range; if the measured frequency is not within the target range, step the voltage value and repeat the loop; and if the measured frequency is within the target range, store the voltage value in the flash memory of the device.

To ensure accuracy, this trimming can be done only at the final test of the complete end product, e.g., a mobile phone. Such late testing is undesirable, and is further undesirable because it consumes significant time in production and requires sophisticated radio-frequency test instruments and software. It also affects the design of the device to the extent that some kind of storage must be provided in the device for the trim value. If this kind of trimming could be eliminated, it would significantly reduce production costs.

SUMMARY

In one aspect of this invention, there is provided a method of calibrating a controllable oscillator in an electronic phase-locked loop (PLL) circuit that includes the steps of initializing the circuit by resetting a counter and setting at least one oscillator control signal to an initial level; and calibrating the oscillator. The oscillator is calibrated by opening a feedback path in the loop circuit; in response to a gating signal, counting pulses at a position in the feedback path in the loop circuit; stopping the counting upon occurrence of a predetermined event determined by the gating signal; comparing a result of the counting to a trim window; and if the result is outside the trim window, adjusting the at least one oscillator control signal and repeating the counting, stopping, and comparing steps. The method may further include closing the feedback path in the loop circuit if the result is inside the trim window.

In another aspect of the invention, there is provided a self-calibrating electronic circuit that includes a PLL and calibration logic. The PLL includes a phase detector that produces a first output signal based on a frequency or phase difference between a reference signal and a feedback path signal, a charge pump that produces a second output signal based on the first output signal, a loop filter that produces a shaped second output signal, a controllable oscillator that produces a third output signal based on the shaped second output signal, and a feedback path that produces the feedback path signal based on the third output signal. The calibration logic opens and taps the feedback path through at least one switch and provides control signals to the controllable oscillator.

In yet another aspect of the invention, there is provided a fractional-N frequency synthesizer electronic circuit that includes a reference oscillator, a PLL driven by a reference signal generated by the reference oscillator, and calibration logic. The PLL includes a phase detector that receives the reference signal and a first output signal from a sigma-delta modulator and that produces a second output signal that is related to a frequency or phase difference between the reference signal and the first output signal. A charge pump receives the second output signal and produces a third output signal based thereon that is shaped by a loop filter, and a controllable oscillator receives the shaped third output signal and produces a fourth output signal based thereon that is an output of the synthesizer electronic circuit and that is provided to a feedback path that includes a pre-scaler that produces a fifth output signal that is provided to the sigma-delta modulator. The calibration logic opens and taps the feedback path through at least one switch and provides output signals to the controllable oscillator.

BRIEF DESCRIPTION OF THE DRAWINGS

The various features, objects, and advantages of Applicant's invention will be understood by reading this description in conjunction with the drawings, in which.

DETAILED DESCRIPTION

Applicants have recognized that a circuit or logic block can be designed to handle trimming of a controllable oscillator such as a VCO autonomously, which is to say that the VCO can self-calibrate. Moreover, the self-calibration/trimming can be handled completely within the product, e.g., a radio. This means that no external instruments or software are needed for trimming. Applicants' solution uses already existing radio blocks and uses the output from these blocks to implement the calibration.

Figure 1:
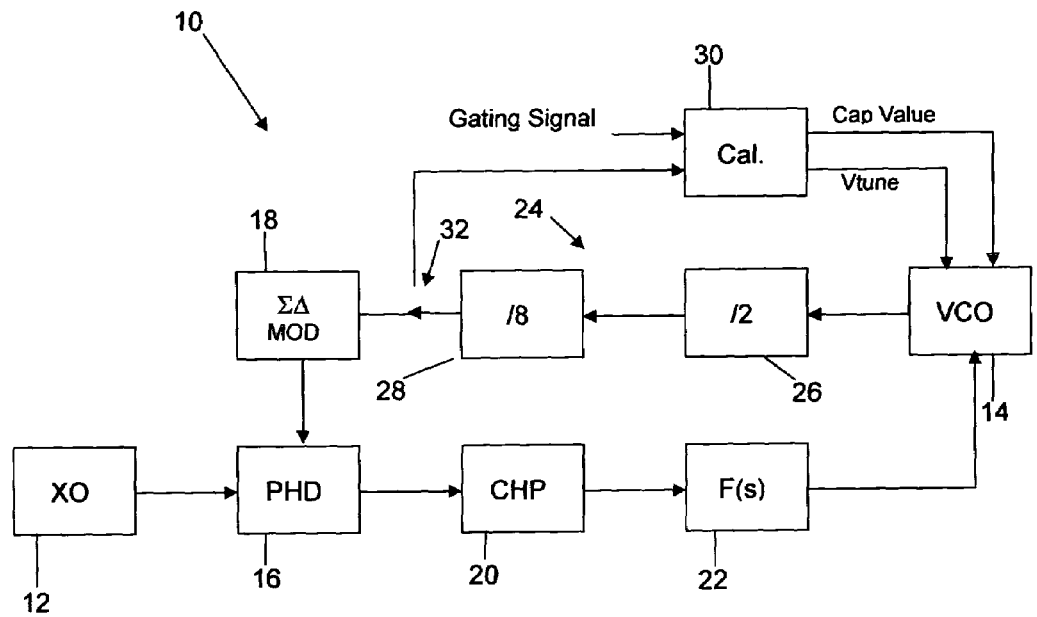
FIG. 1 is a block diagram of a frequency synthesizer in accordance with Applicants' invention.

FIG. 1 is a block diagram of a fractional-N frequency synthesizer 10 that has been modified to implement Applicants' invention. The synthesizer 10 includes a crystal oscillator (XO) 12 that generates a typically sinusoidal reference signal having a known frequency that drives a phase-locked loop that includes a controllable oscillator such as a VCO 14. The XO's output signal is connected to a phase detector (PHD) 16 that also receives an output of a sigma-delta modulator (ΣΔ MOD) 18. The output of the phase detector 16 is a signal that is related to the frequency or phase difference between the reference signal and the output of the modulator 18. For example, the phase detector's output signal may be a train of pulses whose frequency is proportional to the frequency difference or a d.c. signal that is proportional to the phase difference. The output of the phase detector 16 is provided to a charge pump (CHP) 20 that in turn is connected to a loop filter (F(s)) 22. The output of the loop filter 22 is applied to the VCO 14, and the output of the VCO 14 is provided to a frequency divider, or pre-scaler 24. As depicted in FIG. 1, the pre-scaler 24 may include a chain of dividers, the output of which is connected to the modulator 18. As noted above, the output of the modulator 18 is applied to the phase detector 16.

In FIG. 1, the pre-scaler 24 includes a divide-by-two (/2) divider 26 and a divide-by-eight (/8) divider 28. This description treats the pre-scaler as if it includes just the dividers 26, 28 and not the modulator 18, but this is done merely for simplicity of explanation. It will be appreciated that the output of the feedback path between the VCO and the phase detector 16 includes a contribution by the modulator 18. If that contribution is negligible, the frequency of the VCO's output signal is driven to a value that is the frequency of the XO's reference signal divided by the division factor of the prescaler, which is 16 in the arrangement depicted in FIG. 1.

It is well known that this arrangement can be used to control the frequency of the oscillator 14 by controlling the division factor of the pre-scaler. This can be done by directly modifying the dividers in the pre-scaler, which can be difficult, or by injecting a suitable control signal into the modulator 18, which is comparatively easier to do. It will be appreciated that the PLL arrangement depicted in FIG. 1 can be modified in many ways for different applications without changing the basic principle of operation.

Figure 2:
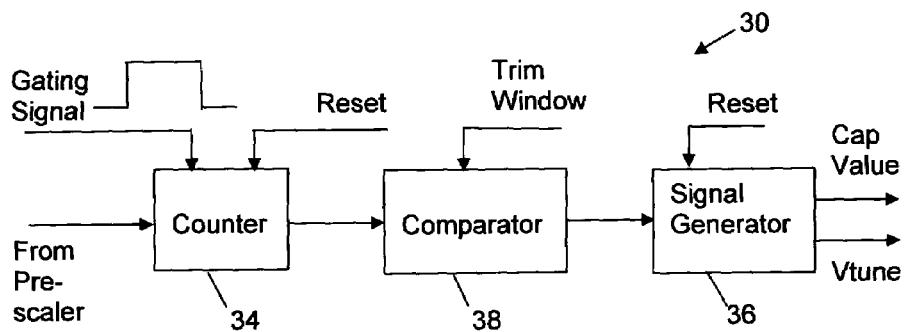
FIG. 2 is a block diagram of a calibration block.

Applicants have recognized the value of adding a new block to the typical PLL circuit. As shown in FIG. 1, the synthesizer 10 includes a new calibration block 30 that taps the feedback path through a switch 32 and provides output signals to the VCO 14. The block 30 can easily be implemented in digital logic or in software since it mainly includes a counter that is gated by a gating signal. FIG. 2 is a block diagram of a suitable arrangement for the calibration block 30. As explained in more detail below, the calibration accuracy depends on the length of the gating signal. To provide for multiple reference frequencies, one can use, for example, information from the sigma-delta modulator 18 as mentioned in the preceding paragraph. The counter 34 in the calibration block 30 should be designed to give proper performance as described in more detail below, but typically a 10-bit counter should be sufficient for VCO self-calibration in a typical radio. It will be recognized that a self-calibration can be triggered in several ways, for example, on power-up of the VCO, or on power-up of the XO, or in response to a software request, at least one of which may initiate the gating signal.

Figure 3:
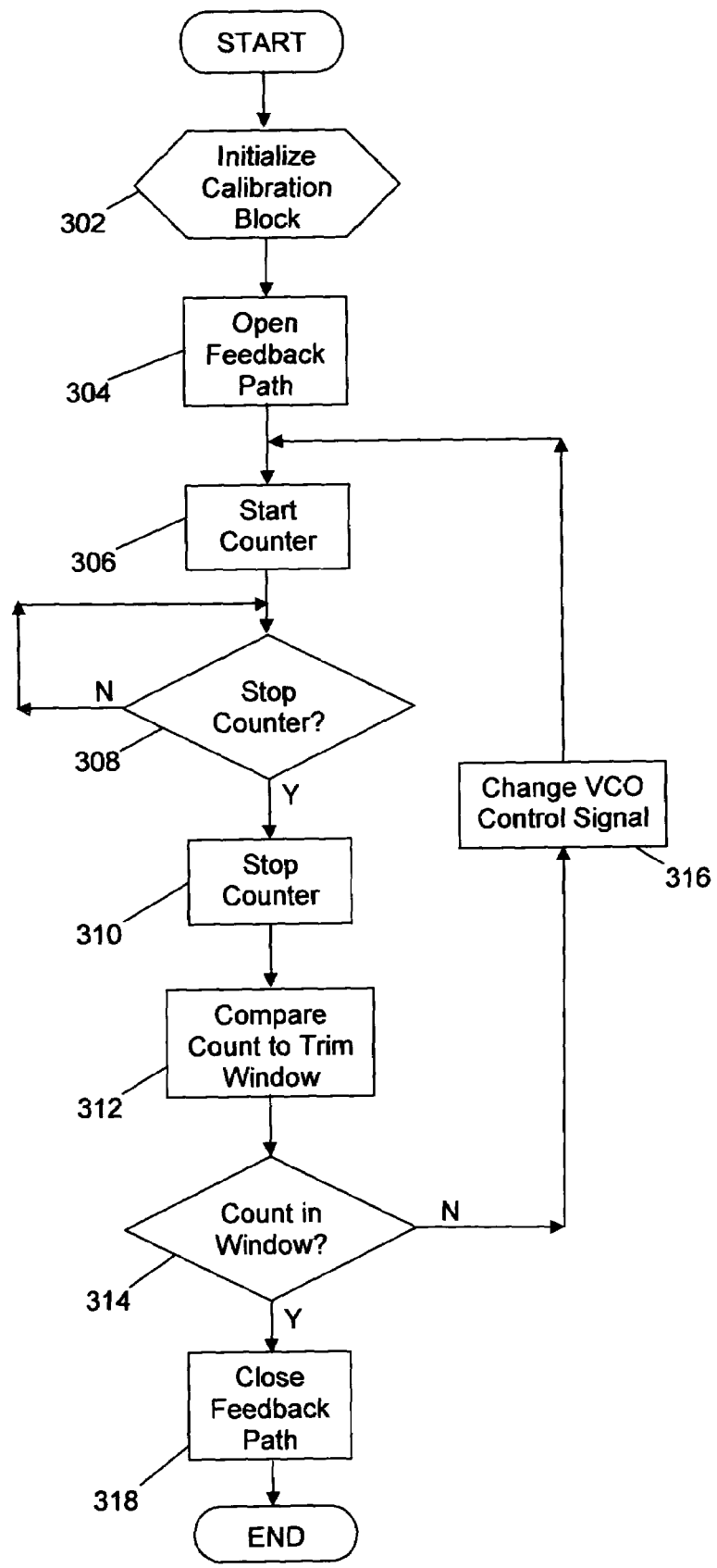
FIG. 3 is a flow chart of a calibration method.

Self-calibration of the arrangement depicted in FIG. 1 is implemented as follows and as illustrated by FIG. 3. In step 302, the circuit is initialized by resetting the counter 34 in the calibration block 30 and setting a control signal Vtune produced by a suitable generator 36 to a calibration level, e.g., the mid-point of a range suitable for the VCO 14. The capacitor value control signal, if produced by the generator 36, is also set to an initial default value. It will be recognized that some particularly advantageous VCOs increase their useful tuning ranges by including arrays of switchable capacitors or the like. Such VCOs are described for example in U.S. Pat. Nos. 6,496,075 and 6,545,555, both to S. Justice et al. Other VCOs do not use capacitors for tuning range selection but have other forms of range selection that operate in similar ways, and so it will be appreciated that for such VCOs, the generator 36 provides a suitable trim or tuning range control signal. Still other VCOs may not have selectable tuning ranges, and so the generator 36 need not provide a tuning range signal.

After initialization, the VCO 14 is calibrated by first opening the PLL's feedback path (step 304), for example with the switch 32 that directs the output of the pre-scaler 24 to the calibration block 30. It will be appreciated that other arrangements are possible; for example, the switch 32 can simply open the feedback path, with the prescaler's output being constantly connected to the calibration block. Moreover, the feedback path can be tapped at other positions, e.g., between the dividers or even at the output of the VCO 14. Thus for example, the switch 32 can open the feedback path and a position in the feedback path can be connected to the calibration block through another switch.

In response to the gating signal, the counter 34 then starts counting the VCO pulses from the pre-scaler (step 306). The counter is stopped by cessation of the gating signal (steps 308, 310). As described in more detail below, the gating signal precisely marks a suitable time period, such as 1.6 microseconds (ps), for counting the VCO pulses. Accordingly, the calibration block 30 includes a circuit that generates the gating signal. Many such circuits may be used to generate the gating signal with its precisely defined duration, such as a fractional-N PLL or divider feeding suitable logic circuitry, a simple resistor-capacitor timer that is charged with a constant current, and a capacitor charged by well-defined current pulses, all with suitably precise component tolerances.

A comparator 38 compares the count result from the counter 34 to a given trim window (step 312), and if the count result is outside the trim window, the signal generator increases or decreases the capacitor value control signal (steps 314, 316), preferably according to whether the count result is too low or too high, and the counter is reset and another count is taken. This repeats until the comparator 38, either alone or in concert with the generator 36, determines that the count result is inside the trim window (step 314). At that point, the calibration is stopped by re-closing the switch 32 (step 318) and the generator 36 maintains the last capacitor value signal until the next calibration.

Applicants' counter 34 is thus responsive to the free-running VCO 14 or a signal derived from it, such as a signal from one of the dividers 26, 28, and to the gating signal, which acts as a start/stop signal for the counter 34.

EXAMPLES

Suppose the goal is to trim a VCO to 2441 MHz with an accuracy of ±20 MHz, which corresponds to about 0.8% of the center frequency. This frequency accuracy is transformed into counts of the counter 34 in the calibration block 30 through Applicants' recognition that if one counts 500 pulses, a difference of ±4 counts is ±0.8%. Of course, it will be appreciated that other numbers of pulses may be used instead. For example, if one counts 1000 pulses, a difference of ±8 counts is ±0.8%.

In the exemplary arrangement depicted in FIG. 1, the nominal signal frequency at the output of the divider /8 in FIG. 1 is 4882/2/8=305.125 MHz, and so the counter increases or decreases its count 305.125 times per µs and the time period that the counter needs to count 500 pulses is 500/305.125=1.6 µs, which is thus the duration of the active window of the gating signal. In this example, calibrating a VCO frequency of 2441 MHz with an accuracy of ±20 MHz (about ±0.8%) has thus been transformed into counting 500 pulses ±4 pulses (±0.8%), which takes 1.6 µs.

It will be appreciated that other values are also suitable. For example, using a count time (gating signal duration) of 2 µs, rather than 1.6 µs, gives a trim window, or target range, of:

low value (2421 MHz)=2.2421/8=605 pulses high value (2461 MHz)=2.2461/8=615 pulses Thus, measuring a frequency of 2441 MHz with an accuracy of ±20 MHz (about ±0.8%) is transformed into counting 610 pulses ±5 pulses (about ±0.8%), which takes 2 µs. If the capacitor array in the VCO 14 has three bits, the capacitor value signal can take on any of eight values, and so the maximum calibration time one may expect with a VCO having such a 3-bit capacitor array is 8.2=16 µs. Allowing for some extra initialization time and comparison time, one may expect a worst-case calibration time of 20 µs, which it will be understood is significantly shorter than the time needed by current trimming methods.

It will be recognized that a 9-bit counter can count 500 pulses, but to allow a larger margin for error, one may count more pulses, so it can be advantageous to use a 10-bit counter. In addition, it will be recognized that the counter in the examples counts two pulses per cycle of the VCO output signal, but that other types of counters can be used instead without departing from the principles of Applicants' invention.

As noted above, Applicants' invention has a number of significant advantages, including for example that the PLL or the device in which it is provided can calibrate itself, with no need for connections to RF or other instrumentation and no special trimming late in production. Moreover, Applicants' calibration process is extremely fast, and can be carried out automatically at power-up with no need to store any calibration values to interact with other system software.

It will be appreciated that procedures described above are carried out repetitively as necessary, for example, to respond to time-varying characteristics of controllable oscillators such as VCOs. To facilitate understanding, many aspects of Applicants' invention are described in terms of sequences of actions that can be performed by, for example, elements of a programmable computer system. It will be recognized that various actions could be performed by specialized circuits (e.g., discrete logic gates interconnected to perform a specialized function or application-specific integrated circuits), by program instructions executed by one or more processors, or by a combination of both.

Moreover, Applicants' invention can additionally be considered to be embodied entirely within any form of computer-readable storage medium having stored therein an appropriate set of instructions for use by or in connection with an instruction-execution system, apparatus, or device, such as a computer-based system, processor-containing system, or other system that can fetch instructions from a medium and execute the instructions. As used here, a "computer-readable medium" can be any means that can contain, store, communicate, propagate, or transport the program for use by or in connection with the instruction-execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium include an electrical connection having one or more wires, a portable computer diskette, a random-access memory (RAM), a read-only memory (ROM), an erasable programmable read-only memory (EPROM or Flash memory), and an optical fiber.

Thus, the invention may be embodied in many different forms, not all of which are described above, and all such forms are contemplated to be within the scope of the invention. For each of the various aspects of the invention, any such form may be referred to as "logic configured to" perform a described action, or alternatively as "logic that" performs a described action.

It is emphasized that the terms "comprises" and "comprising", when used in this application, specify the presence of stated features, integers, steps, or components and do not preclude the presence or addition of one or more other features, integers, steps, components, or groups thereof.

The particular embodiments described above are merely illustrative and should not be considered restrictive in any way. The scope of the invention is determined by the following claims, and all variations and equivalents that fall within the range of the claims are intended to be embraced therein.

What is claimed is:

1. A method of calibrating a controllable oscillator in an electronic phase-locked loop circuit, comprising the steps of:

initializing the circuit by resetting a counter and setting at least one oscillator control signal to tune said controllable oscillator to an initial level; and calibrating the oscillator by:
opening and tapping a feedback path in the loop circuit;
in response to a gating signal, counting pulses at a the tapped position in the feedback path in the loop circuit;
stopping the counting upon occurrence of a predetermined event determined by the gating signal;
comparing a result of the counting to a trim window; and
if the result is outside the trim window, adjusting the at least one oscillator control signal and repeating the counting, stopping, and comparing steps.

2. The method of claim 1, further comprising the step of closing the feedback path in the loop circuit if the result is inside the trim window.

3. The method of claim 1, wherein the at least one oscillator control signal is set to a predetermined calibration level.

4. The method of claim 1, wherein the at least one oscillator control signal includes a trim value control signal that is maintained on closing the feedback path.

5. The method of claim 1, wherein opening the feedback path in the loop circuit causes a counter to count the pulses at the position in the feedback path.

6. The method of claim 1, wherein the counting is stopped by cessation of the gating signal.

7. The method of claim 1, wherein the predetermined event is at least one of an edge of the gating signal and a lapse of a predetermined amount of time.

8. A self-calibrating electronic circuit, comprising:
a phase-locked loop (PLL), wherein the PLL comprises:
a phase detector that produces a first output signal based on a frequency or phase difference between a reference signal and a feedback path signal,
a charge pump that produces a second output signal based on the first output signal,
a loop filter that produces a shaped second output signal, and
a controllable oscillator that produces a third output signal based on the shaped second output signal, and
a feedback path that produces the feedback path signal based on the third output signal; and
calibration logic that opens and taps the feedback path through at least one switch and provides control signals to the controllable oscillator;
wherein the calibration logic includes a counter that is gated by a gating signal and that counts pulses in the feedback path signal.

9. The circuit of claim 8, wherein the counter is a 10-bit counter.

10. The circuit of claim 8, wherein the calibration logic is triggered by at least one of power-up of the controllable oscillator, initiation of the reference signal, and a request signal.

11. The circuit of claim 8, wherein the feedback path includes a chain of dividers.

12. The circuit of claim 11, wherein the chain of dividers includes at least a divide-by-two divider.

13. A fractional-N frequency synthesizer electronic circuit, comprising:
a reference oscillator;
a phase-locked loop (PLL) driven by a reference signal generated by the reference oscillator, wherein the PLL comprises:
a phase detector that receives the reference signal and a first output signal from a sigma-delta modulator and that produces a second output signal that is related to a frequency or phase difference between the reference signal and the first output signal,
a charge pump that receives the second output signal and produces a third output signal based thereon that is shaped by a loop filter, and
a controllable oscillator that receives the shaped third output signal and produces a fourth output signal based thereon that is an output of the synthesizer electronic circuit and that is provided to a feedback path that includes a pre-scaler that produces a fifth output signal that is provided to the sigma-delta modulator; and
calibration logic that opens and taps the feedback path through at least one switch and provides output signals to the controllable oscillator.

14. The circuit of claim 13, wherein the calibration logic includes a counter that is gated by a gating signal and that counts pulses in the fifth output signal.

15. The circuit of claim 14, wherein the counter is a 10-bit counter.

16. The circuit of claim 13, wherein the calibration logic is triggered by at least one of power-up of the controllable oscillator, power-up of the reference oscillator, and a request signal.

17. The circuit of claim 13, wherein the pre-scaler that produces the fifth output signal includes a chain of dividers.

18. The circuit of claim 17, wherein the chain of dividers includes at least a divide-by-two divider.

* * * * *